United States Patent [19]

Edson

[11] 4,396,893
[45] Aug. 2, 1983

[54] FREQUENCY SELECTIVE LIMITER

[75] Inventor: William A. Edson, Los Altos Hills, Calif.

[73] Assignee: The United States of America as represented by the Secretary of the Navy, Washington, D.C.

[21] Appl. No.: 269,153

[22] Filed: Jun. 1, 1981

[51] Int. Cl.³ .............................................. H03H 7/01
[52] U.S. Cl. .................................. 333/17 L; 307/565; 328/169; 333/175
[58] Field of Search ............................. 333/17 L, 175; 328/169–171, 167; 307/540, 543, 556, 565; 455/308, 309

[56] References Cited

U.S. PATENT DOCUMENTS 3,098,937  7/1963  Martens .............................. 307/88.5

OTHER PUBLICATIONS

Robert M. Lerner, Band–Pass Filters with Linear Phase, Proc. of IEEE, vol. 52, No. 3, pp. 249–268.
J. R. Pierce, Paralleled–Resonator Filters, Proc. of the I.R.E., Feb. 1949.
A. J. Giarola, A Review of the Theory, Characteristics, and Operation of Frequency Selective Limiters, Proc. of IEEE, vol. 67, No. 10, Oct. 1979.

Primary Examiner—Paul L. Gensler
Attorney, Agent, or Firm—R. S. Sciascia; Charles D. B. Curry; William C. Daubenspeck

[57] ABSTRACT

A frequency selective limiter comprising a plurality of LC series-resonant filters having resonant frequencies uniformly spaced over the passband. Each filter is formed of two identical LC series-resonant sections with a diode limiter coupled between the two sections. The filters are coupled in parallel between the limiter input and the load to form two groups having alternate resonant frequencies with signals passing through one group being shifted in phase by 180° relative to signals passing through the other group.

4 Claims, 2 Drawing Figures

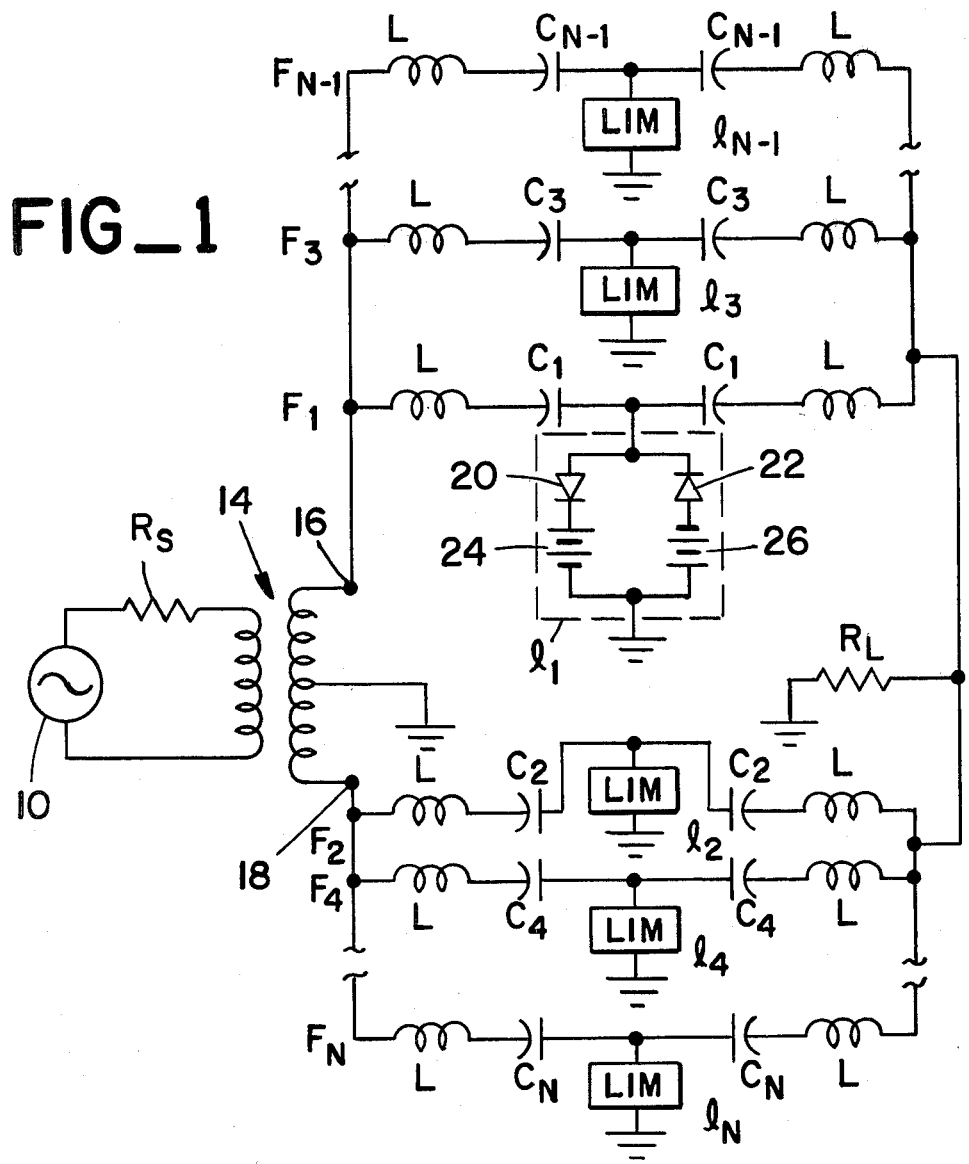
FIG_1
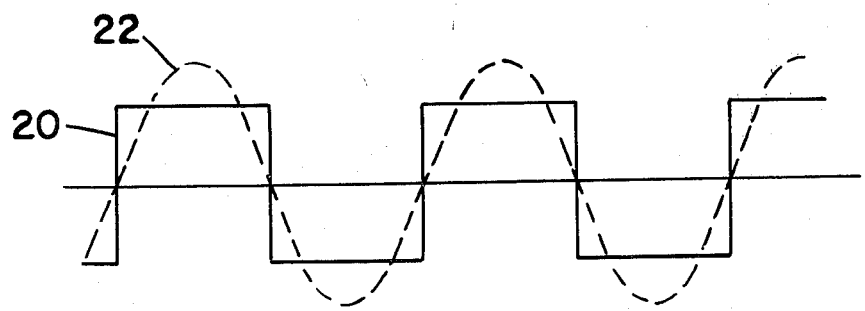
FIG_2

FREQUENCY SELECTIVE LIMITER

BACKGROUND OF THE INVENTION

1. Field of the Invention

The invention relates in general to frequency-selective limiters and, in particular, to frequency-selective limiters using multiple LC-resonant circuits.

2. Description of Prior Art

The ideal frequency-selective limiter operates as a bandpass filter for all input signals within its bandwidth and at power levels below a threshold value and limits the output due to input signals above the threshold value to the threshold value. The need for frequency selective limiting in wide-band receivers is well recognized. This is especially true in military communication systems where strong signals of a hostile or an indifferent nature are present at the same time that there is a need to receive much weaker signals.

In general, the frequency-selective limiting is accomplished by performing a frequency partition in the front end to form separate channels, separately limiting the signals in each channel, and then recombining the channels to a single port. In the case of military communications systems, a receiving system having a very large bandwidth, 2 MHz to 30 MHz for example, may be required. In such a situation a large number (100–1,000) of separate channels are necessary to provide the desired frequency-selective limiting. Typically the frequency partitioning is provided by a series of contiguous bandpass filters, each consisting of a cascade of resonators. In addition to introducing unwanted phase shifts into the system which complicate the task of recombining the outputs, the necessary large number of cascaded resonators limits the number of channels in a practical device because of the space, weight and expense required.

SUMMARY OF THE INVENTION

It is therefore an object of the present invention to provide a lumped-element frequency-selective limiter having a characteristic closely approximating the ideal frequency-selective limiter characteristic.

Another object of the present invention is to provide a lumped-element frequency-selective limiter having the desired characteristic which requires fewer components than previous lumped-element frequency-selective limiters thus reducing the space, weight and expense involved or allowing for an increased number of limiting channels.

The present invention utilizes the teachings of bandpass filters as disclosed in "Band-Pass Filters with Linear Phase", Proceedings of the IEEE, Vol. 52, No. 3, pp. 249–268, 1964 by Robert M. Lerner (See also "Paralleled-Resonator Filters", Proceedings of the I.R.E., Feb. 1949 by J. R. Pierce) to provide a lumped-element frequency-selective limiter employing a minimum number of components. Lerner discloses a bandpass filter with linear phase in which a number of LC series resonant circuits are connected in parallel and tuned to frequencies at equal intervals across the pass band. In a frequency selective limiter according to the present invention, each LC series resonant circuit as defined by Lerner is formed in two identical sections (or resonators). A diode limiter is inserted between the two sections of each resonant circuit to limit the power in each resonant circuit in their individual pass bands. The use of two LC resonant sections shelters both the input circuit and the output circuit from the diode limiter. The frequency-selective limiter operates as a bandpass filter with linear phase for signals below the threshold of the limiter and limits the input signals above the threshold to the threshold value.

Other advantages and features of the present invention will become apparent from the following detailed description of the invention when considered in conjunction with the accompanying drawings wherein:

BRIEF DESCRIPTION OF THE DRAWINGS

FIG. 1 is a schematic drawing illustrating a frequency-selective limiter according to the present invention; and FIG. 2 illustrates the operation of the frequency-selective limiter for a very large input signal undergoing hard limiting.

DESCRIPTION OF THE PREFERRED EMBODIMENT

Referring now to FIG. 1 which illustrates a frequency-selective limiter according to the present invention, an input signal represented by signal source 10 and source resistance $R_S$ is coupled by a center-tapped transformer 14 to a multiplicity of series resonant filters $F_1$, $F_2$, ... $F_N$ which are tuned to frequencies $f_1$, $f_2$, ... $f_N$ at equal intervals $2\Delta f$ across the desired passband. The filters $F_1$, $F_3$, $F_5$, ... having alternate resonant frequencies $f_1$, $f_3$, $f_5$, ... are coupled in parallel between one high side 16 of the center-tapped transformer 14 and the load represented by resistor $R_L$. In a preferred case all three windings of transformer 14 have equal numbers of turns, and the load resistor $R_L$ is equal to the source resistor $R_S$. The other filters $F_2$, $F_4$, $F_6$, ... having alternate resonant frequencies $f_2$, $f_4$, $f_6$, ... are coupled in parallel between the other high side 18 of the transformer 14 and the load $R_L$.

Each filter $F_1$, $F_2$, ... $F_N$ includes two identical sections with each section consisting of an inductor and a capacitor connected in series. All the inductances may be of the same magnitude L where L is determined according to the load resistance $R_L$ by the relationship: $R_L$ equals $4/\pi$ times the calculated impedance of L at a frequency of $2\Delta f$ Hz ($2\Delta f$ is the difference between successive resonant frequencies). The capacitors $C_1$, $C_2$, ... $C_N$ of each resonator filter are then selected to provide the required resonant frequencies. Thus the inductors are one-half as large and the capacitors are twice as large as those in the filter disclosed by Robert M. Lerner in the previously mentioned article. Also Lerner uses the symbol R to represent the sum of $R_L + R_S$.

A diode limiter $l_1$, $l_2$, ... $l_N$ is coupled to each resonator filter $F_1$, $F_2$, ... $F_N$ between the two sections thereof. Typically, as shown at filter $F_1$, the limiters $l_1$, $l_2$, ... $l_N$ include two back-to-back diodes 20 and 22 and bias voltage supplies 24 and 26. However, limiters of other types may be substituted within the scope of this invention.

The operation of the frequency-selective limiter of FIG. 1 for small signals, that is, signals below the threshold of the limiters $l_1$, $l_2$, ... $l_N$, will be considered first. For small signals, the frequency-selective limiter operates as a bandpass filter with linear phase as described in the article by Lerner and consequently as such has all of the advantages and characteristics of the bandpass filters described therein. Consider the case where the input signal is at one of the resonant frequencies $f_1, f_2, \ldots f_N$. Such a signal will be coupled from the primary of the transformer 14 to the center-tapped secondary from which it will pass freely to the load $R_L$ through the appropriate path. The signals at frequencies $f_1, f_3, \ldots f_{N-1}$ will pass through the upper leg 16 of the transformer secondary (as shown in FIG. 1) and through the filters $F_1, F_3, \ldots F_{N-1}$ having the appropriate resonant frequencies. Similarly the signals at frequencies $f_2, f_4, \ldots f_N$ will pass through the lower leg 18 of the transformer secondary and through the filters $F_2, F_4, \ldots F_N$ having the appropriate resonant frequencies. Thus, relative to the phase at the transformer primary, the phase of the signals at alternate resonant frequencies is shifted 180° at the load $R_L$. An important transition case is for an input signal having a frequency one-half way between adjacent resonant frequencies; in this case the power is split between the two resonators, one resonator being inductively detuned and one resonator being capacitively detuned. The resulting signal at the load $R_L$ has the same magnitude as a signal at any of the resonant frequencies but has a relative phase difference of 90°. Thus, a linear phase shift with frequency is provided.

Turning now to the operation of the frequency-selective limiter for input signals having a magnitude greater than the threshold voltage of the limiters $l_1, l_2, l_3, \ldots l_N$, the two sections of the filters serve to shelter both the input circuit and the output circuit from the limiter. As in the case of the small signals, the larger signals pass through the appropriate filter or filters as determined by the resonant frequency, here designed $f_i$. The corresponding section of the filter $F_i$ before the diode limiter $l_i$ allows the signals at resonant frequencies to pass while preventing signals at other frequencies from reaching the limiter at levels which may produce undesirable intermodulation or disrupt the transmission of the resonant frequency. The limiter $l_i$ then operates to limit signals above the threshold determined by bias voltage supplies 24 and 26. The section of the filter $F_i$ following the diode limiter $l_i$ gives a second stage of filtering which again discriminates between the resonant frequency and undesirable frequencies which may be present in the output of the diode limiter $l_i$. As the amplitude of the input signal to a limiter $l_i$ increases from the threshold value to the hard limiting condition shown in FIG. 2, the high Q factor of the second section of the resonator filter provides smoothing to the limited signal 20 so that the output signal has a waveshape which is very close to the fundamental component of the input signal as indicated by the dashed line 22. (NB The fundamental component of any square wave has a peak value that is $\pi/2$ times larger than the square wave itself).

Thus signals of magnitude below the threshold of the limiters $l_1, l_2, \ldots l_n$ pass freely through the appropriate filters, while larger signals of magnitude above the threshold are limited to the threshold value. The frequency selective limiter will limit the magnitude of the output so that a very strong input signal, for example, will not exceed the dynamic range of an amplifier connected to the output of the limiter. The only exception of this desired situation occurs if a small signal and a large signal are rather close in frequency, (i.e., traveling in the same resonator) the larger signal may obscure the smaller signal to an extent dependent on their actual separation, even though the larger has been limited to the threshold value. The severity of this limitation can be diminished by making the frequency separation between adjacent resonator filters very small.

Obviously, many modifications and variations of the present invention are possible in light of the above teachings. It is therefore to be understood that within the scope of the appended claims the invention may be practiced otherwise than as specifically described.

What is claimed is:

1. A frequency-selective limiter circuit for operating as a bandpass filter for input signals within its pass band and below a threshold power level and limiting signals within its passband and above the threshold level to the threshold level, which comprises:
    (a) a plurality of resonant circuits $F_1, F_2, \ldots F_N$ for separating and recombining the input signals, said resonant circuits having resonant frequencies $f_1, f_2, \ldots f_N$ uniformly spaced over the passband of said frequency-selective limiter, each resonant circuit having an input section and an output section with the input section including a single inductor and a single capacitor and the output section including a single inductor and a single capacitor identical to the inductor and capacitor of the input section, said resonant circuits being coupled to said input signals so that input signals at adjacent resonant frequencies are phase shifted by 180°; and
    (b) limiter means inserted between said input section and said output section of each resonant circuit for limiting to the threshold level the amplitude of the signals passing through said resonant circuit.

2. The frequency selective limiter as recited in claim 1 wherein the capacitor and the inductor of each said input section are connected in series and the capacitor and the inductor of each said output section are connected in series.

3. The frequency selective limiter as recited in claim 2 wherein each inductor has an identical fixed inductance value wherein the value is determined by $R_L$ equals $4/\pi$ times the calculated impedance of the inductor at a frequency equal to the difference between adjacent resonant frequencies, where $R_L$ is the load of the frequency selective limiter.

4. The frequency selective limiter as recited in claim 1 wherein said limiter means comprises two diodes coupled back-to-back and biased for forward conductivity at said threshold level.

* * * * *